(12) United States Patent
Hong et al.

(10) Patent No.: US 10,698,019 B2
(45) Date of Patent: Jun. 30, 2020

(54) METHOD OF ONLINE ESTIMATING REMAINING LIFE OF MOVING POWER CABLE

(71) Applicant: Chung Yuan Christian University, Taoyuan (TW)

(72) Inventors: Ying-Yi Hong, Taoyuan (TW); Chun-Yao Lee, Chung Li (TW); Chun-Yi Liu, Taichung (TW)

(73) Assignee: Chung Yuan Christian University, Taoyuan ( * ) Notice: Subject to any disclaimer, the term of this patent is extended or adjusted under 35 U.S.C. 154(b) by 46 days.

(21) Appl. No.: 16/192,902

(22) Filed: Nov. 16, 2018

(65) Prior Publication Data
US 2020/0158773 A1 May 21, 2020

(51) Int. Cl.
| | | |
|---|---|---|
| *G06F 17/18* | (2006.01) | |
| *G01R 31/02* | (2006.01) | |
| *G01R 31/10* | (2006.01) | |
| *G06N 3/08* | (2006.01) | |
| *G01R 31/08* | (2020.01) | |

(52) U.S. Cl.
CPC ........... *G01R 31/10* (2013.01); *G01R 31/083* (2013.01); *G01R 31/088* (2013.01); *G06N 3/08* (2013.01)

(58) Field of Classification Search
None
See application file for complete search history.

(56) References Cited

U.S. PATENT DOCUMENTS

| | | | | |
|---|---|---|---|---|
| 9,395,279 B2* | 7/2016 | Hsu | ............... | G01N 1/04 |
| 10,393,788 B2* | 8/2019 | Kim | ............... | G01R 31/1272 |
| 2016/0161541 A1* | 6/2016 | Kim | ............... | G01R 31/1272 |
| | | | | 702/58 |
| 2020/0011903 A1* | 1/2020 | Menzel | ............... | G06F 16/9035 |

FOREIGN PATENT DOCUMENTS

| | | | | |
|---|---|---|---|---|
| CN | 104268626 B | * | 4/2017 | ............... G06N 3/02 |
| CN | 108051364 A | * | 5/2018 | ............. G01N 17/00 |
| EP | 2033060 B1 | * | 4/2013 | ......... G01R 19/2513 |

OTHER PUBLICATIONS

A. H. Ranjbar et al "Application of Artificial Neural Network in Cable Life Time Estimation and its Failure rate per 100 km" , Dec. 2008, IEEE, 2nd IEEE Confenernce on Power and Energy (PECON 08), pp. 22-25 (Year: 2008).*

(Continued)

*Primary Examiner* — Jermele M Hollington
(74) *Attorney, Agent, or Firm* — Jackson IPG PLLC; Demian K. Jackson

(57) ABSTRACT

A method is presented to estimate the remaining life of a moving power cable online. The cable is monitored online remotely for further providing suggestions to users for reducing times of power failure and economic loss. An offline AC impedance measurement experiment is designed at first. Three artificial neural networks are established for convert measured impedances into impedances under a baseline context to calculate impedance change ratios. The impedance change ratio indicates the damage of the cable. At last, a remaining margin of the impedance change ratio is figured out online under various contexts with three equations. Thus, the remaining life of the cable is obtained online.

8 Claims, 4 Drawing Sheets

(56) References Cited

OTHER PUBLICATIONS

Translation description of CN104268626B Power Cable Service Life Estimation Method and System (Year: 2017).*
Translation description of CN108051364A Method for Evaluating Remaining Life of EPR Nuclear Power cable and Method for Predicting Remaining Life of EPR Nuclear Power cable (Year: 2018).*

* cited by examiner

METHOD OF ONLINE ESTIMATING REMAINING LIFE OF MOVING POWER CABLE

TECHNICAL FIELD OF THE INVENTION

The present invention relates to estimating the remaining life of a cable; more particularly, to using artificial neural networks (ANN) to analyze data offline for further calculating the remaining life of a cable online, where the cable is monitored online without being dismantled for handling the degree of deterioration and predicting the life.

DESCRIPTION OF THE RELATED ARTS

A port logistics equipment system requires uninterrupted continuous movements. The power cable also moves accordingly. When the power cable fails, the production will be directly affected as resulting in loss. When a high-tech or chemical plant is elevated to an intelligent production level, the functioning of key components must be accurately handled and predicted for intelligence management. In particular, the cable plays an important role for providing power. Some prior arts for estimating the remaining life of the cable are as follows: A prior is a method for evaluating the aging life of the insulation material of a cable, which uses dielectric loss angle and breaking elongation; another prior art is a method and a system for estimating the life of a power cable, which uses physical features (insulation thickness, microporous impurities, thermal elongation, permanent elongation, breaking elongation and tensile strength) to estimate the life of the cable with ANN; another prior art is a method and a system for evaluating the life of a high-pressure single-core cable, which uses Weibull distribution for estimating the life of the cable; another prior art is a method for estimating the life of a cable based on ANN, which uses the life of a high-temperature cable for estimating the life of the cable through ANN; and another prior art is a method for detecting the life of a cable of cross-linked polyethylene (XLPE), which uses dielectric loss angle together with ANN to estimate the remaining life of the cable. Regarding related documents, the followings are found: A. H. Ranjbar, et al. use temperature with the coordination of ANN to train the ANN with the data of cable damage simulated by a mathematical model (A. H. Ranjbar, R. Adnani, H. Omranpour, 'Application of Artificial Neural Network in Cable Life Time Estimation and its Failure rate per 100 km' 2008 IEEE 2nd International Power and Energy Conference, Pages: 22-25); and Zairul Aida Abu Zarim, et al. control temperature and electric oven to accelerate the damaging of a cable for building an experimental data and then equation of inverse power law is used to offline estimate the remaining life (Zairul Aida Abu Zarim, Tashia Marie Anthony, 'Development of Remaining Life Estimation for MV PILC due to Electrical Stress using Statistical Method' 2012 IEEE International Conference on Condition Monitoring and Diagnosis, Pages: 1151-1155). The above methods use experimental or field data, and then dismantle the operating cable to offline calculate the estimated life. But, the ANN is not trained with measured data through experiment. The aging data obtained through the training are not close to the actual data.

Still, another prior art is a method for monitoring the life of a power cable based on the carrier communication on the mask layer, which uses a camera to online take the image of the sheath of the cable to be transmitted to a remote control center through the cable itself for monitoring the life of the cable. But, if the cable itself is aged, the image cannot be completely shown in the control center. In another document of Fred Steennis, et al., online partial discharging and risk indicators are used to estimate the life of a cable with the coordination of traveling wave. But, some kinds of discharging cost high and are dangerous (Fred Steennis; Paul Wagenaars; Peter van der Wielen; Peter Wouters; Yan Li; Tjeerd Broersma; Denny Harmsen; Pascal Bleeker, 'Guarding MV cables on-line: With travelling wave based temperature monitoring, fault location, PD location and PD related remaining life aspects' IEEE Transactions on Dielectrics and Electrical Insulation Year: 2016, Volume: 23, Issue: 3, Pages: 1562-1569). In another document of Sijia Liu, four high-frequency signal features of neutral voltage and current are extracted for estimating the life of a cable. But, no environmental impacts are considered (Sijia Liu; Yi Wang; Fuqiang Tian, 'Prognosis of Underground Cable via Online Data-Driven Method with Field Data' IEEE Transactions on Industrial Electronics Year: 2015, Volume: 62, Issue: 12, Pages: 7786-7794). In summary, the above prior art and two related documents do not well consider the aging or the environmental impact toward the cable for estimating the life of the cable.

Hence, the prior arts do not fulfill all users' requests on actual use.

SUMMARY OF THE INVENTION

The main purpose of the present invention is to use ANNs to analyze data offline for further calculating the remaining life of a cable online, where a novel method uses a bending machine to damage the cable for simulating the actual aging situation; and the cable is monitored online without being dismantled for handling the degree of deterioration and predicting the life.

To achieve the above purposes, the present invention is a method of online estimating the remaining life of a moving power cable, where a bending machine accelerates in damaging a cable by bending to simulate the required uninterrupted continuous movements in a port logistics equipment system, comprising steps of: (a) designing an experiment of alternating-current (AC) impedance measurement to obtain an AC impedance database offline with the consideration of different ACs and temperatures of a cable, where the experiment obtains AC impedance changes of the cable on changing bending-damage times and defined contexts; and each one of the defined contexts is a combination of a temperature and a current of the cable; (b) obtaining a first ANN to fit data obtained from the experiment of AC impedance measurement to obtain AC impedances of the cable under the defined contexts, where the first ANN processes fitting according to the bending-damage times with the data obtained from the experiment; and a plurality of fitted data of the first ANN is thus obtained to obtain a plurality of curve surfaces of impedances relating to the defined contexts; (c) obtaining a second ANN to fit the fitted data of the first ANN to obtain the AC impedances under different counts of the bending-damage times, where the impedance values under a plurality of the defined contexts are obtained from the plurality of curved surfaces of impedances of the first ANN to obtain the impedance values corresponding to the different counts of the bending-damage times under the defined contexts; and a plurality of fitted curves of the second ANN are thus obtained, whose data contain the impedance values under the different counts of the bending-damage times; (d) obtaining a third ANN to fit the data of the fitted curves of the second ANN to convert measured values under the defined contexts into values of a baseline context and calculate out a plurality of impedance change ratios, where an ANN training is processed with data of per thousand bending-damage times in the data of the fitted curves of the second ANN under a plurality of the defined contexts; and the third ANN is inputted with the plurality of the defined contexts and the corresponding impedance values under the plurality of the defined contexts to output the impedance change ratios under the baseline context corresponding to the different counts of the bending-damage times; (e) online measuring ACs, temperatures and impedances of the cable; (f) calculating a remaining margin of the impedance change ratio of the cable; and (g) converting the remaining margin of the impedance change ratio of the cable into a remaining life of the cable with Equation 1, Equation 2 and Equation 3, where the Equation 1, Equation 2 and Equation 3 are as follows:

$$r'' = r_{now} + \frac{\Delta r}{\Delta t} \times \Delta t, \quad \text{Equation 1}$$

$$r'' = r_{now} + \frac{\Delta r}{\Delta t} \times \Delta t + \frac{\Delta^2 r}{\Delta t^2} \times \Delta t^2 \text{ and} \quad \text{Equation 2}$$

$$r'' = r_{now} + \frac{\Delta r}{\Delta t} \times \Delta t + \frac{\Delta^2 r}{\Delta t^2} \times \Delta t^2 + \frac{\Delta^3 r}{\Delta t^3} \times \Delta t^3; \text{ and} \quad \text{Equation 3}$$

where r" is a limit of the impedance change ratio under the baseline context (10 Celsius degrees (° C.) and an AC of 10 amperes (A)), $r_{now}$ is the impedance change ratio obtained online from the third ANN, $$\frac{\Delta r}{\Delta t}$$

is a change amount (i.e. first-order difference quotient) of the impedance change ratio in a period of time, $$\frac{\Delta^2 r}{\Delta t^2}$$

is a second-order difference quotient, $$\frac{\Delta^3 r}{\Delta t^3}$$

is a third-order difference quotient and Δt is the remaining life of the cable. Accordingly, a novel method of online estimating the remaining life of a moving power cable is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

Figure 1:
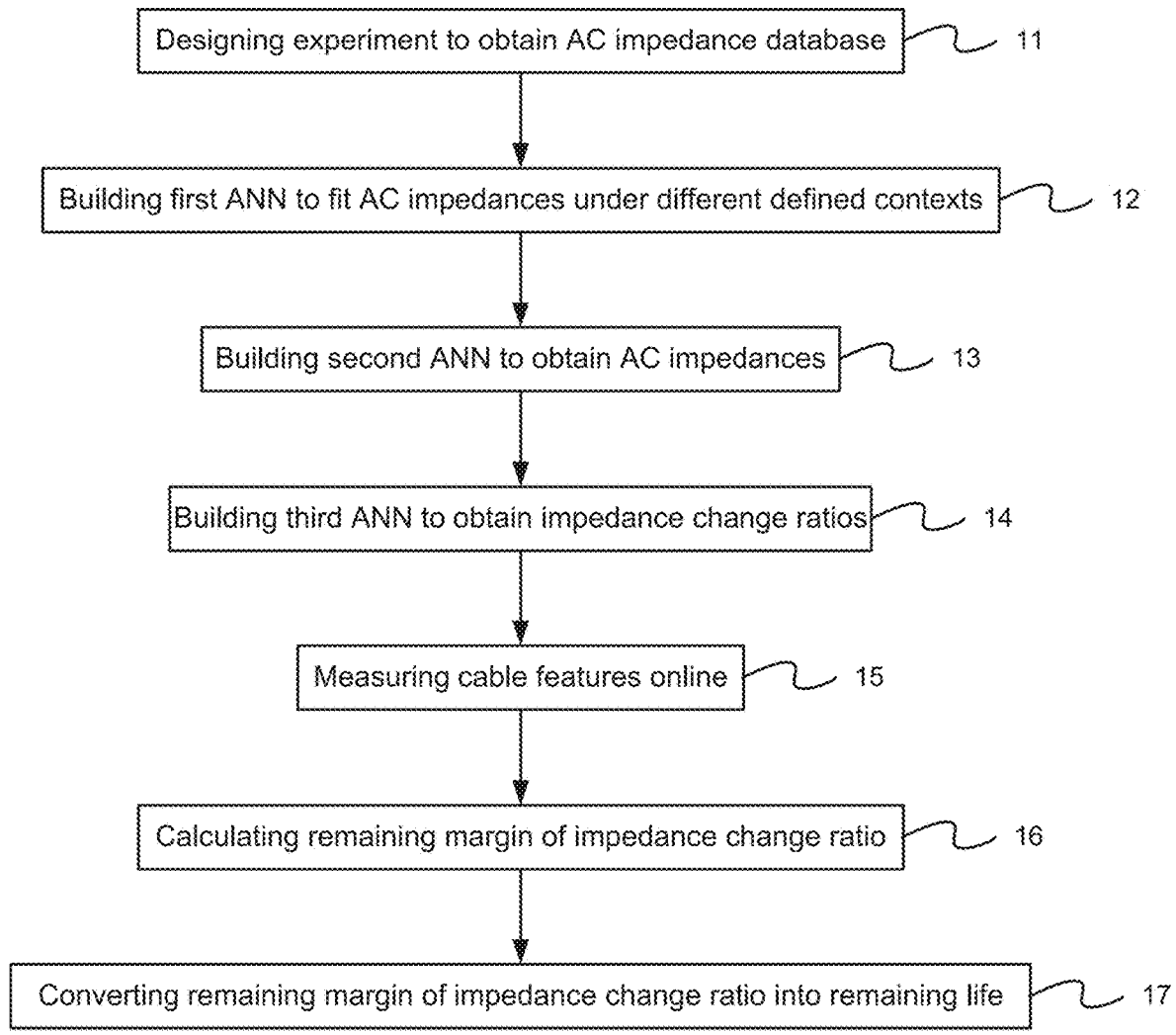
FIG. 1 is the flow view showing the preferred embodiment according to the present invention.

The following description of the preferred embodiment is provided to understand the features and the structures of the present invention.

Please refer to FIG. 1 to FIG. 4, which are a flow view showing a preferred embodiment according to the present invention; a view showing the comparison between measured data and ANN fitted data; a view showing the remaining life of a cable calculated through Equation 1, Equation 2 and Equation 3; and a view showing the estimated remaining life of the cable. As shown in the figures, the present invention is a method of online estimating the remaining life of a moving power cable, comprising the following steps:

(a) Designing experiment to obtain alternating-current (AC) impedance database 11: An offline AC impedance measurement experiment is designed to build an AC impedance database with the consideration of different ACs and temperatures of a cable.

The purpose of the experiment is to acquire the changes of AC impedance of the cable on changing bending-damage times and defined contexts. Therein, the defined contexts are 28 combinations for the cable where its temperature changes per 5 Celsius degrees (° C.) between 10° C. and 40° C. and its current changes per 2.5 amperes (A) between 2.5 A and 10 A. Conventionally, aging of the cable is accelerated by heating up to high temperature; yet, the present invention uses a machine to accelerate in damaging the cable by bending for simulating the required uninterrupted continuous movements in a port logistics equipment system. The present invention further uses a thermal cycler to control an ambient temperature and the temperature of the cable to be kept in a range of −30° C.~+60° C. Besides, the present invention also uses a load of constant current source to control the current of the cable to be kept in a range of 0~100 A.

The data obtained from the above experiment are used to train ANNs. At first, the present invention defines a baseline context as 10° C. and 10 A. The ANNs can convert the impedance values under different contexts into impedance values under the baseline context for calculating impedance change ratios. The impedance change ratio represents the damage of the cable and, when the limit of the impedance change ratio is 150 percent (%), the life of the cable is defined as ended. The building of ANNs is processed as follows.

(b) Building first ANN to fit AC impedances under different defined contexts 12: A first ANN is built to fit the AC impedances of the cable under the different defined contexts with data obtained from the experiment. According to 6 counts of bending-damage times, 6 fitted data of the first ANN is built.

The first ANN is built to fit the data measured from the experiment. The measured data of the defined context are not exactly data required (e.g. 2.5 A, 5 A, 7.5 A, 10 A). For Example, Table 1 shows the experimental data under the bending-damage times of 0 for 10° C. (in fact, the fixed 10° C. is not possible). The values corresponding to the different defined contexts are fitted by the first ANN built with the data obtained from the experiment. For example, Table 2 shows the AC impedance values corresponding to different current contexts at 10° C. while Table 3 shows the parameters for training the first ANN. Therein, with the 6 counts of bending-damage times, including 0, 100, 150, 170, 180 and 200 thousand times, the first ANN processes fitting to obtain the 6 curved surfaces of impedance relating to the different defined contexts.

TABLE 1

| Experiment No. | Temperature (° C.) | Current (A) | Cable across-voltage (mV) | Cable impedance (mΩ) |
|---|---|---|---|---|
| 1 | 9.7 | 2.45 | 6.86 | 2.800 |
| 2 | 9.8 | 5.89 | 15.78 | 2.679 |
| 3 | 9.8 | 7.86 | 20.78 | 2.644 |
| 4 | 9.8 | 11.11 | 28.83 | 2.595 |

TABLE 2

| Experiment No. | Current (A) | Impedance (mΩ) |
|---|---|---|
| 1 | 2.5 | 2.8011 |
| 2 | 5.0 | 2.7020 |
| 3 | 7.5 | 2.6523 |
| 4 | 10.0 | 2.6141 |

TABLE 3

| | Number of neurons | Activation function | Variable | Remark |
|---|---|---|---|---|
| Input layer | 2 | — | Cable temperature Cable current | Base values used for pu: Base value of temperature: 40° C. Base value of current: 10A |
| Output layer | 1 | purelin | AC impedance | |
| Hidden layer | 3 | logsig | — | |

(c) Building second ANN to obtain AC impedances 13: A second ANN is built to fit the AC impedances under the different bending-damage times with the fitted data of the first ANN for building the data of 28 fitted curves of the second ANN according to the 28 defined contexts used in the experiment.

Figure 2:
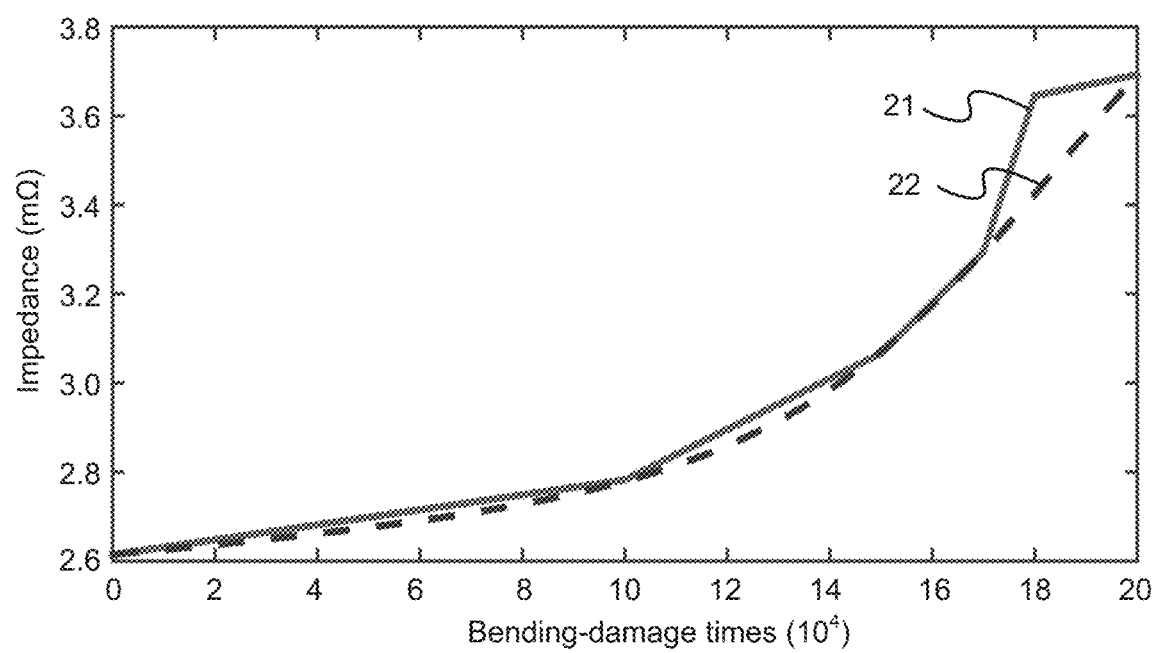
FIG. 2 is the view showing the comparison between the measured data and the artificial-neural-network (ANN) fitted data.

The impedance values under the 28 defined contexts are taken out from the 6 curved surfaces of impedance of the first ANN to obtain the impedance values under the defined contexts corresponding to the bending-damage times. Thus, the second ANN is built to process fitting to obtain the impedance values under the different bending-damage times with a total of the 28 fitted curves obtained. Table 4 shows the parameters for training the second ANN. FIG. 2 shows an example for 0 bending-damage times at 10° C. under 10 A, where the solid line shows the measured data of the experiment and the dashed line shows the fitted data of the ANN.

TABLE 4

| | Number of neurons | Activation function | Variable | Remark |
|---|---|---|---|---|
| Input layer | 1 | — | Bending-damage times | |

TABLE 4-continued

| | Number of neurons | Activation function | Variable | Remark |
|---|---|---|---|---|
| Output layer | 1 | purelin | AC impedance | |
| Hidden layer | 2 | logsig | — | |

According to the result obtained above, the records of per thousand bending-damage times are obtained from each curve. Thus, for 0~200 thousand bending-damage times, 201 corresponding impedance data are obtained from 5628 records in 28 curves for the defined contexts.

(d) Building third ANN to obtain impedance change ratios 14: A third ANN is built to fit the data of the fitted curves of the second ANN to convert measured values under the defined contexts into values of a baseline context and calculate out a plurality of impedance change ratios.

An ANN training is processed with the 5628 records of per thousand bending-damage times obtained from the data of 28 fitted curves of the second ANN. Therein, the impedance values, the temperatures and the currents of the cable are inputted to obtain the impedance change ratios of the cable corresponding to the bending-damage times under the baseline context, which means the records of per thousand bending-damage times for the 28 defined contexts are inputted and the outputs are the corresponding impedance change ratios under the baseline context.

The third ANN is inputted with the defined contexts and the corresponding impedance values under the defined contexts to output the impedance change ratios under the baseline context (10° C. and an AC of 10 A) corresponding to the different counts of bending-damage times. The impedance change ratio is calculated by subtracting an impedance (per-unit, pu) under the baseline context from an impedance (pu) under the defined context. Table 5 shows the parameters for training the third ANN.

TABLE 5

| | Number of neurons | Activation function | Variable | Remark |
|---|---|---|---|---|
| Input layer | 3 | — | AC impedance Cable temperature Cable current | Base values used for pu: Base value of impedance: 2.61 mΩ Base value of temperature: 40° C. Base value of current: 10A |
| Output layer | 1 | purelin | Impedance change ratio corresponding to bending-damage times under baseline context | |
| Hidden layer | 5 | logsig | — | |

In step (b) to step (d), the data obtained from the experiment are used to train ANNs to obtain the impedance change ratio representing the damage of the cable. Then, the following steps use the impedance change ratio to estimate the remaining life of the cable.

(e) Measuring cable features online 15: online measuring ACs, temperatures and impedances of said cable;

(f) Calculating remaining margin of impedance change ratio 16:calculating a remaining margin of the impedance change ratio of the cable; and (g) Converting remaining margin of impedance change ratio into remaining life 17:The remaining margin of the impedance change ratio of the cable is converted into a remaining life of the cable with one of the following conversion equations. Therein, the conversion equations are Equation 1, Equation 2 and Equation 3 as follows:

(1) Linear Equation:

$$r'' = r_{now} + \frac{\Delta r}{\Delta t} \times \Delta t; \qquad \text{Equation 1}$$

(2) Quadratic Equation:

$$r'' = r_{now} + \frac{\Delta r}{\Delta t} \times \Delta t + \frac{\Delta^2 r}{\Delta t^2} \times \Delta t^2; \qquad \text{Equation 2}$$

and (3) Cubic Equation:

$$r'' = r_{now} + \frac{\Delta r}{\Delta t} \times \Delta t + \frac{\Delta^2 r}{\Delta t^2} \times \Delta t^2 + \frac{\Delta^3 r}{\Delta t^3} \times \Delta t^3, \qquad \text{Equation 3}$$

where r'' is the limit of the impedance change ratio under the baseline context (10° C. and an AC of 10 A); $r_{now}$ is the impedance change ratio obtained online from the third ANN;

$$\frac{\Delta r}{\Delta t}$$

is a change amount (i.e. first-order difference quotient) of the impedance change ratio in a period of time;

$$\frac{\Delta^2 r}{\Delta t^2}$$

is a second-order difference quotient;

$$\frac{\Delta^3 r}{\Delta t^3}$$

is a third-order difference quotient; and Δt is the remaining life of the cable.

Equation 1, Equation 2 and Equation 3 are used in various conditions according to statements relating to positivity and negativity of difference quotients, and the statements are as follows:

(1) Equation 3 is used when $$\frac{\Delta^3 r}{\Delta t^3} > 0$$

to indicate the cable as lowly damaged;

(2) Equation 2 is used when $$\frac{\Delta^3 r}{\Delta t^3} < 0$$

and $$\frac{\Delta^2 r}{\Delta t^2} > 0$$

to indicate the cable as medium damaged; and (3) Equation 1 is used when $$\frac{\Delta^3 r}{\Delta t^3} < 0$$

and $$\frac{\Delta^2 r}{\Delta t^2} < 0$$

to indicate the cable as highly damaged.

The above equations are solved as follows:

(1) Solution of the Linear Equation:

$$\Delta t = \frac{r'' - r_{now}}{\frac{\Delta r}{\Delta t}} \qquad \text{Equation 4}$$

(2) Solution of the Quadratic Equation:

When the quadratic equation is as follows: $ax^2+bx+c=0$, $a \neq 0$ and the discriminant is defined as Δ and $\Delta = b^2 - 4ac$, (i) two unequal real roots exist as Δ>0:

$$x_{1,2} = \frac{-b \pm \sqrt{b^2 - 4ac}}{2a}; \qquad \text{Equation 5}$$

(ii) two equal real roots exist as Δ=0:

$$x_{1,2} = \frac{-b}{2a}; \qquad \text{Equation 6}$$

and (iii) a pair of conjugate complex roots exist as Δ<0:

$$x_{1,2} = \frac{-b \pm \sqrt{b^2 - 4ac}}{2a}. \qquad \text{Equation 7}$$

On solving this equation, only the situation of Δ>0 is possible, which solves out two roots for a positive one and a negative one:

$$\Delta t_{1,2} = \frac{-\frac{\Delta r}{\Delta t} \pm \sqrt{\left(\frac{\Delta r}{\Delta t}\right)^2 - 4 \times \frac{\Delta^2 r}{\Delta t^2} \times (r_{now} - r'')}}{2 \times \frac{\Delta^2 r}{\Delta t^2}}.$$ Equation 8

Therein, the real number roots in $\Delta t_{1,2}$ are the estimated remaining life of the cable.

(3) Solution of the Cubic Equation:

When the cubic equation is $ax^3+bx^2+cx+d=0$, $a \neq 0$ and the discriminant is defined as $\Lambda$ and $$\Lambda = \left(\frac{bc}{6a^2} - \frac{b^3}{27a^3} - \frac{d}{2a}\right)^2 + \left(\frac{c}{3a} - \frac{b^2}{9a^2}\right)^3,$$

(i) a real root and two conjugate complex roots exist as $\Lambda > 0$;
(ii) three real roots exist as $\Lambda = 0$, where three identical real roots exist for $$\left(\frac{bc}{6a^2} - \frac{b^3}{27a^3} - \frac{d}{2a}\right)^2 = -\left(\frac{c}{3a} - \frac{b^2}{9a^2}\right)^3 = 0;$$

and two identical ones exist in three real roots for $$\left(\frac{bc}{6a^2} - \frac{b^3}{27a^3} - \frac{d}{2a}\right)^2 = -\left(\frac{c}{3a} - \frac{b^2}{9a^2}\right)^3 \neq 0;$$

and
(iii) three different real roots exist as $\Lambda < 0$.

On solving the cubic equation, mostly $\Lambda > 0$ and the only real root is the remaining life of the cable, and the other two conjugated complex roots are unreasonable. On rear occasions of $\Lambda < 0$, the only positive real root is the remaining life of the cable, and the other two negative real roots are unreasonable.

Figure 3:
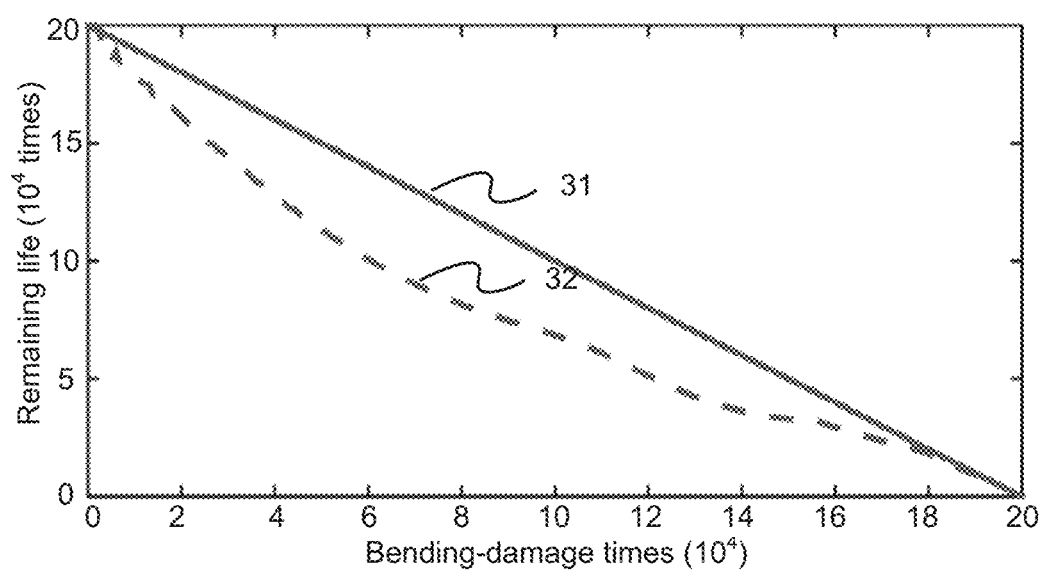
FIG. 3 is the view showing the remaining life of the cable calculated through Equation 1, Equation 2 and Equation 3.

The remaining life of the cable is estimated through step (a) to step (g) with the experiment, where the life is represented by the bending-damage times. The ending of the life of the cable is defined as 150% of the AC impedance change ratio, which is corresponding to about 200 thousand bending-damage times. By inputting the data of the experiment into Equation 1, Equation 2 and Equation 3, the estimated results are obtained as shown in FIG. 3, where the solid line shows the actual life and the dashed line shows the estimated life.

Figure 4:
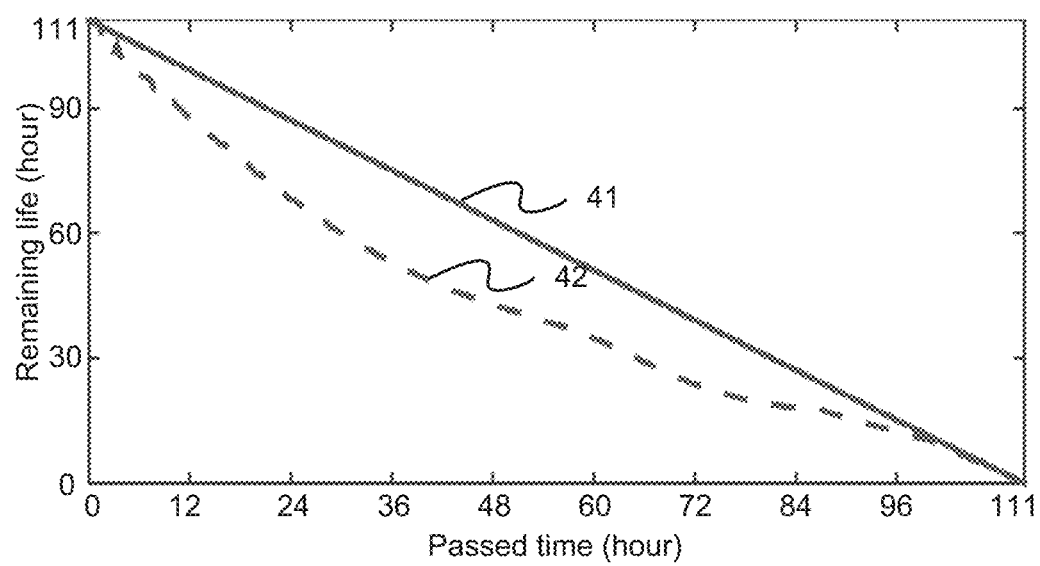
FIG. 4 is the view showing the estimated remaining life of the cable.

The bending-damage times has a speed about 30 times per minute. By converting the bending-damage times into units of time (hour), the final results are obtained as shown in FIG. 4, where the solid line shows the actual life and the dashed line shows the estimated life.

The present invention provides a method for estimating the remaining life of a moving power cable online. The cable is monitored online remotely to further provide suggestions to user for reducing times of power failure and economic loss. The present invention designs an offline AC impedance measurement experiment, at first, to establish a first ANN for finding the relationship among the impedance and the current and temperature of the cable. Then, a second ANN is further established for finding the relationship between the rising of the impedance during damaging the cable and the current and temperature of the cable. Again, a third ANN is established to fit the data obtained from the experiment. These ANNs convert the measured impedances into the impedances under a baseline context to calculate impedance change ratios, where the impedance change ratio indicates the damage of the cable. At last, with Equation 1, Equation 2 and Equation 3 provided in the present invention, a remaining margin of the impedance change ratio is figured out online under various contexts; and, thus, the remaining life of the moving power cable is obtained online.

Thus, the present invention can be applied in smart-cable industries, where a green environmental cable can be monitored online and the time point for required maintenance and replacement can be estimated. This will be a product development trend which must be mastered by the cable industries. Regarding the smart cable, the present invention can be applied in the following areas:

a. The infrastructure of the logistics system must be operated in an uninterrupted continuous way. When facilities fail, efficiency is directly affected as resulting in loss.

b. When a plant (especially in a high-tech or chemical industry) is elevated to an intelligent level, the functioning of key components must be accurately handled and predicted for intelligent management.

c. Renewable power generation will be dramatically increased in the future. A stable and reliable electric energy injected to the grid must be ensured.

To sum up, the present invention is a method of online estimating the remaining life of a moving power cable, where ANNs are used to analyze data offline for further calculating the remaining life of a cable online; a novel method of using a bending machine to damage the cable is used for simulating the actual aging situation; and the cable is monitored online without being dismantled for handling the degree of deterioration and predicting the life.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method of online estimating the remaining life of a moving power cable,
   wherein a machine accelerates in damaging a cable by bending to simulate the required uninterrupted continuous movements in a port logistics equipment system, comprising steps of:
   (a) designing an experiment of AC impedance measurement to obtain an AC impedance database offline with the consideration of different alternating currents (ACs) and temperatures of a cable,
     wherein said experiment obtains AC impedance changes of said cable on changing bending-damage times and defined contexts; and each one of said defined contexts is a combination of a temperature and a current of said cable;
   (b) obtaining a first artificial neural network (ANN) to fit data obtained from said experiment of AC impedance measurement to obtain AC impedances of said cable under said defined contexts,
     wherein said first ANN processes fitting according to said bending-damage times with said data obtained from said experiment; and a plurality of fitted data of said first ANN is thus obtained to obtain a plurality of curve surfaces of impedances relating to said defined contexts;

(c) obtaining a second ANN to fit said fitted data of said first ANN to obtain said AC impedances under different counts of said bending-damage times,
  wherein said impedance values under a plurality of said defined contexts are obtained from said plurality of curved surfaces of impedances of said first ANN to obtain said impedance values corresponding to said different counts of said bending-damage times under said defined contexts; and a plurality of fitted curves of the second ANN are thus obtained, whose data contain said impedance values under said different counts of said bending-damage times;

(d) obtaining a third ANN to fit the data of said fitted curves of said second ANN to convert measured values under said defined contexts into values of a baseline context and calculate out a plurality of impedance change ratios,
  wherein an ANN training is processed with data of per thousand bending-damage times in said data of said fitted curves of said second ANN under a plurality of said defined contexts; and said third ANN is inputted with said plurality of said defined contexts and corresponding impedance values under said plurality of said defined contexts to output said impedance change ratios under said baseline context corresponding to said different counts of said bending-damage times;

(e) online measuring ACs, temperatures and impedances of said cable;

(f) calculating a remaining margin of said impedance change ratio of said cable; and (g) converting said remaining margin of said impedance change ratio of said cable into a remaining life of said cable with Equation 1, Equation 2 and Equation 3,
  wherein said Equation 1, Equation 2 and Equation 3 are as follows:

$$r'' = r_{now} + \frac{\Delta r}{\Delta t} \times \Delta t, \quad \text{Equation 1}$$

$$r'' = r_{now} + \frac{\Delta r}{\Delta t} \times \Delta t + \frac{\Delta^2 r}{\Delta t^2} \times \Delta t^2 \text{ and} \quad \text{Equation 2}$$

$$r'' = r_{now} + \frac{\Delta r}{\Delta t} \times \Delta t + \frac{\Delta^2 r}{\Delta t^2} \times \Delta t^2 + \frac{\Delta^3 r}{\Delta t^3} \times \Delta t^3, \quad \text{Equation 3}$$

wherein r" is a limit of said impedance change ratio under said baseline context (10 Celsius degrees (° C.) and an AC of 10 amperes (A)); $r_{now}$ is said impedance change ratio obtained online from said third ANN;

$$\frac{\Delta r}{\Delta t}$$

is a change amount (i.e. first-order difference quotient) of said impedance change ratio in a period of time;

$$\frac{\Delta^2 r}{\Delta t^2}$$

is a second-order difference quotient;

$$\frac{\Delta^3 r}{\Delta t^3}$$

is a third-order difference quotient; and Δt is said remaining life of said cable.

2. The method according to claim 1,
  wherein, in step (a), a thermal cycler is further used to control an ambient temperature and said temperature of said cable to be kept in a range of −30° C.~+60° C.

3. The method according to claim 1,
  wherein, in step (a), a load of constant current source is further used to control said current of said cable to be kept in a range of 0-100 A.

4. The method according to claim 1,
  wherein said impedance change ratio is calculated by subtracting an impedance (per-unit, pu) under said baseline context from an impedance (pu) under said defined context.

5. The method according to claim 1,
  wherein said Equation 1, said Equation 2 and said Equation 3 are used in various conditions according to statements relating to positivity and negativity of difference quotients, and said statements are as follows:
Equation 3 is used when $$\frac{\Delta^3 r}{\Delta t^3} > 0$$

to indicate said cable as lowly damaged;
Equation 2 is used when $$\frac{\Delta^3 r}{\Delta t^3} < 0$$

and $$\frac{\Delta^2 r}{\Delta t^2} > 0$$

to indicate said cable as medium damaged; and
Equation 1 is used when $$\frac{\Delta^3 r}{\Delta t^3} < 0$$

and $$\frac{\Delta^2 r}{\Delta t^2} < 0$$

to indicate said cable as highly damaged.

6. The method according to claim 1,
  wherein said life of said cable is defined as ended on reaching said limit of said impedance change ratio being a percentage of 120 percent (%)~180%.

7. The method according to claim 1,
wherein, in step (b), with 6 counts of said bending-damage times, including 0, 100, 150, 170, 180 and 200 thousand times, said first ANN processes fitting to obtain 6 curved surfaces of impedances relating to said defined contexts.

8. The method according to claim 1,
wherein, in step (a), said defined contexts are 28 combinations of said temperature changed per 5° C. between 10° C. and 40° C. and said current changed per 2.5 A between 2.5 A and 10 A of said cable; in step (b), said first ANN processes fitting with 6 counts of said bending-damage times to obtain 6 of said fitted data of said first ANN to obtain 6 of said curve surfaces of impedances relating to said defined contexts; in step (c), said impedance values under said 28 of said defined contexts are obtained from said 6 of said fitted curves of said first ANN to be corresponding to said bending-damage times to obtain data of 28 fitted curves of said second ANN;

wherein said impedance values under said bending-damage times are obtained to obtain a total of said 28 fitted curves; and, in step (d), an ANN training is processed with 5628 records of per thousand bending-damage times obtained from said data of said 28 fitted curves of said second ANN obtained in step (c); and wherein said third ANN is inputted with said impedance values, said temperatures and said currents of said cable through measuring online to output said impedance change ratios of said cable corresponding to said bending-damage times under said baseline context (10° C. and an AC of 10 A).

* * * * *